(12) United States Patent
Son

(10) Patent No.: US 9,739,461 B2
(45) Date of Patent: Aug. 22, 2017

(54) LIGHTING APPARATUS AND FABRICATING METHOD THEREOF

(71) Applicant: LG DISPLAY CO., LTD., Seoul (KR)

(72) Inventor: Sehwan Son, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 71 days.

(21) Appl. No.: 14/437,109

(22) PCT Filed: Dec. 9, 2013

(86) PCT No.: PCT/KR2013/011363
§ 371 (c)(1),
(2) Date: Apr. 20, 2015

(87) PCT Pub. No.: WO2014/088381
PCT Pub. Date: Jun. 12, 2014

(65) Prior Publication Data
US 2015/0267903 A1 Sep. 24, 2015

(30) Foreign Application Priority Data
Dec. 7, 2012 (KR) .................. 10-2012-0141534

(51) Int. Cl.
*F21V 21/00* (2006.01)
*F21K 9/00* (2016.01)
*H05B 33/08* (2006.01)
*F21Y 105/00* (2016.01)
*H05B 37/02* (2006.01)
*F21Y 115/15* (2016.01)
*F21Y 113/10* (2016.01)
*F21Y 115/10* (2016.01)

(52) U.S. Cl.
CPC ............... *F21V 21/00* (2013.01); *F21K 9/00* (2013.01); *H05B 33/0857* (2013.01); *F21Y 2105/00* (2013.01); *F21Y 2113/10* (2016.08); *F21Y 2115/10* (2016.08); *F21Y 2115/15* (2016.08); *H05B 33/0896* (2013.01); *H05B 37/02* (2013.01); *H05K 2201/10113* (2013.01)

(58) Field of Classification Search
CPC . F21V 21/00; F21K 9/00; F21K 99/00; H05B 33/0857; H05B 33/0896; H05B 37/02; F21Y 2113/10; F21Y 2115/15; F21Y 2101/00; F21Y 2105/00; F21Y 2105/008; F21Y 2105/006; F21Y 2111/00; H05K 2201/10113
See application file for complete search history.

(56) References Cited

U.S. PATENT DOCUMENTS 5,952,782 A 9/1999 Nanto et al.
6,952,079 B2 * 10/2005 Shiang ................... F21V 15/01
313/504
(Continued)

FOREIGN PATENT DOCUMENTS

CN 1146941 C 4/2004
CN 102412243 A 4/2012
(Continued)

*Primary Examiner* — Bao Q Truong
(74) *Attorney, Agent, or Firm* — Dentons US LLP

(57) ABSTRACT

This specification relates to a lighting apparatus, including a support and three or more surface light source panels provided on the support. The surface light source panel has two or more types of light-emitting colors.

19 Claims, 11 Drawing Sheets

(56) References Cited

U.S. PATENT DOCUMENTS

| | | | |
|---|---|---|---|
| 8,215,787 B2* | 7/2012 | Mathai | H01L 51/52 362/147 |
| 8,414,304 B2* | 4/2013 | Mathai | H01L 27/3209 257/E21.026 |
| 9,320,109 B2* | 4/2016 | Lai | H05B 37/02 |
| 2003/0227582 A1 | 12/2003 | Yu et al. | |
| 2007/0029906 A1 | 2/2007 | Hack et al. | |
| 2007/0139920 A1 | 6/2007 | Van De Ven et al. | |
| 2009/0244885 A1 | 10/2009 | Watanabe et al. | |
| 2010/0039030 A1 | 2/2010 | Winters et al. | |
| 2010/0046210 A1 | 2/2010 | Mathai et al. | |
| 2010/0076527 A1 | 3/2010 | Hammond et al. | |
| 2010/0225252 A1* | 9/2010 | Weaver | H01L 27/3211 315/312 |
| 2011/0157893 A1* | 6/2011 | Ngai | F21S 2/00 362/249.02 |
| 2011/0284899 A1 | 11/2011 | Hack et al. | |
| 2011/0286211 A1 | 11/2011 | Kubota | |

FOREIGN PATENT DOCUMENTS

| | | |
|---|---|---|
| CN | 202419232 U | 9/2012 |
| JP | 11-353919 A | 12/1999 |
| JP | 2007-180524 A | 7/2007 |
| JP | 2007537577 A | 12/2007 |
| JP | 2009543348 A | 12/2009 |
| JP | 201165910 A | 3/2011 |
| JP | 2012151101 A | 8/2012 |
| JP | 2012527011 A | 11/2012 |
| KR | 1020050062537 A | 6/2005 |
| KR | 10-2005-0103845 A | 11/2005 |
| KR | 10-0826582 B1 | 4/2008 |
| KR | 1020090060211 A | 6/2009 |
| KR | 2020120001737 U | 3/2012 |
| TW | 201205892 A1 | 2/2012 |
| WO | 2011012461 A | 2/2011 |

* cited by examiner

[Fig. 1]
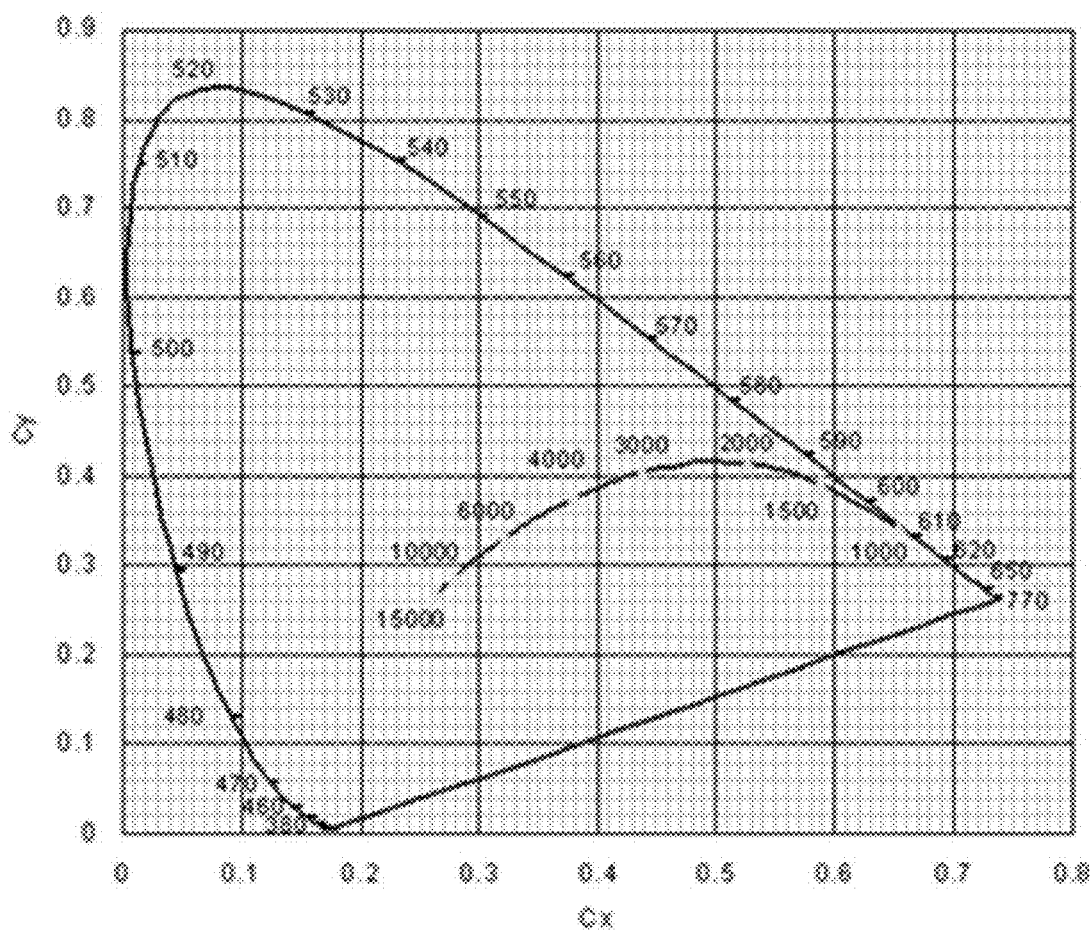

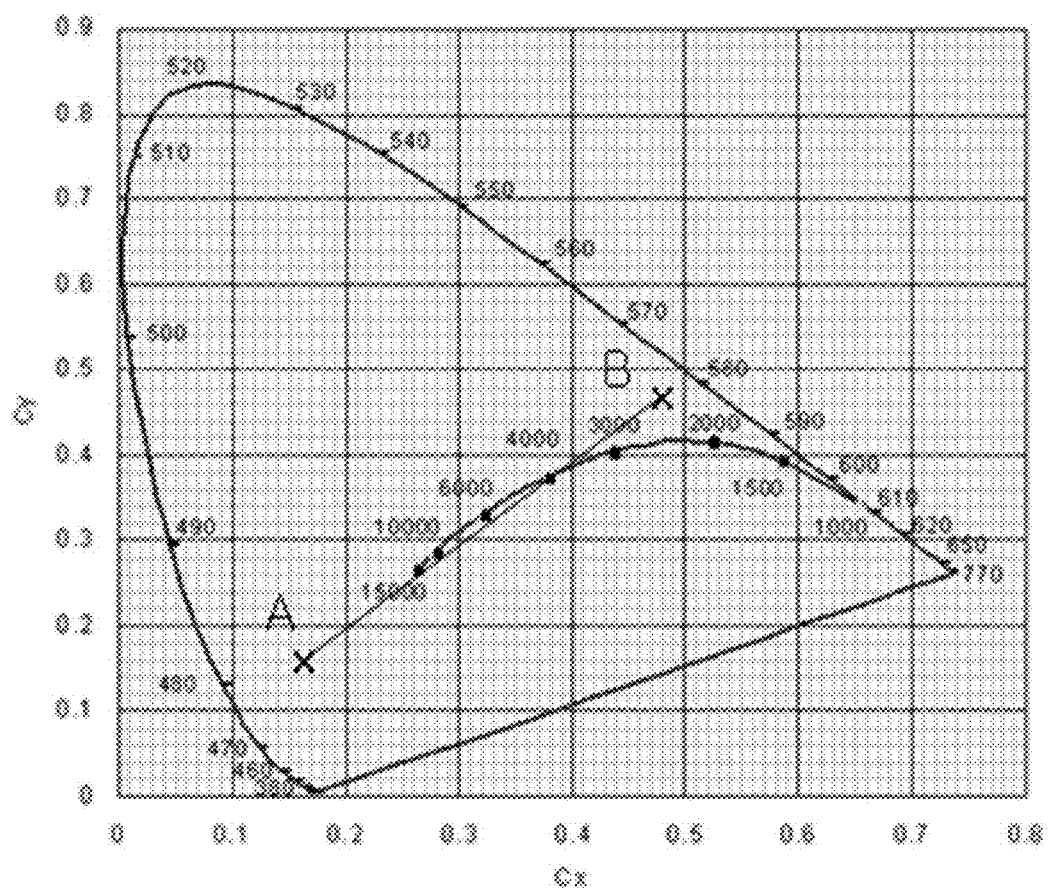
[Fig. 2]

[Fig. 3]
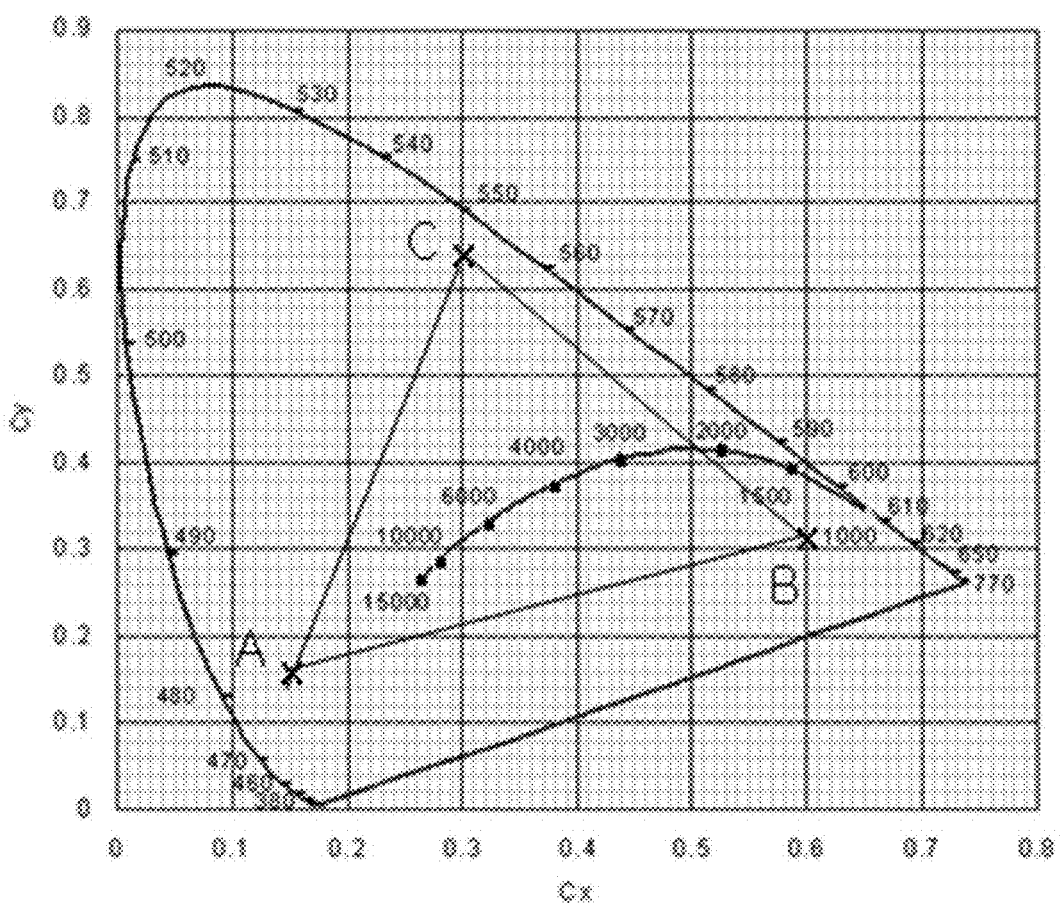

[Fig. 4]
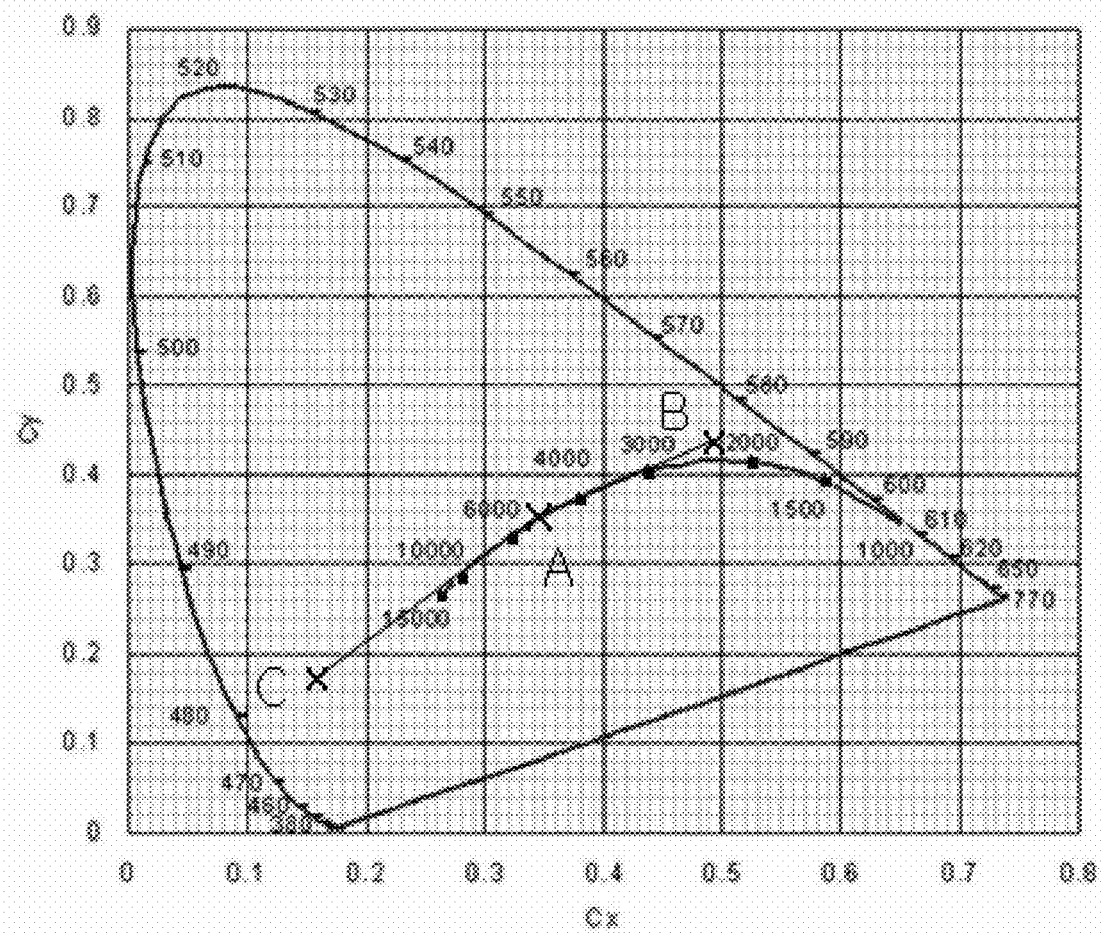

【Fig. 5】
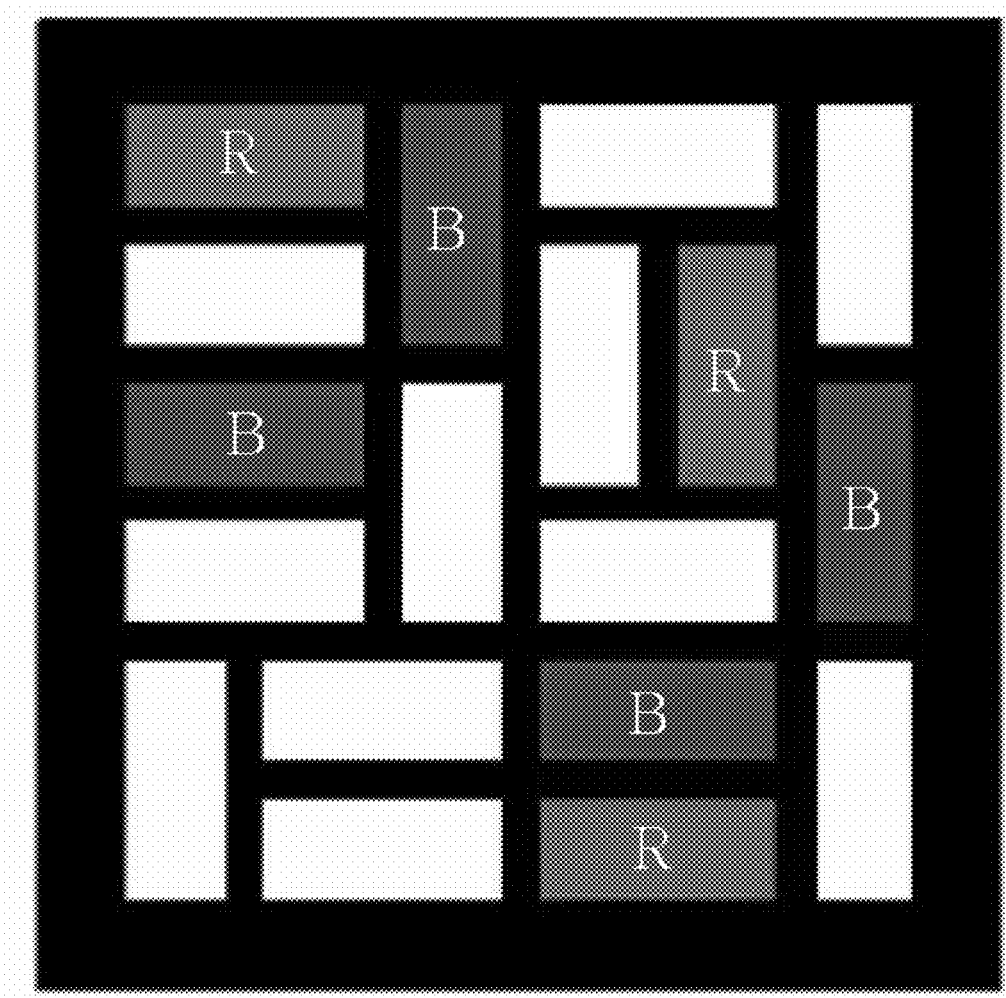

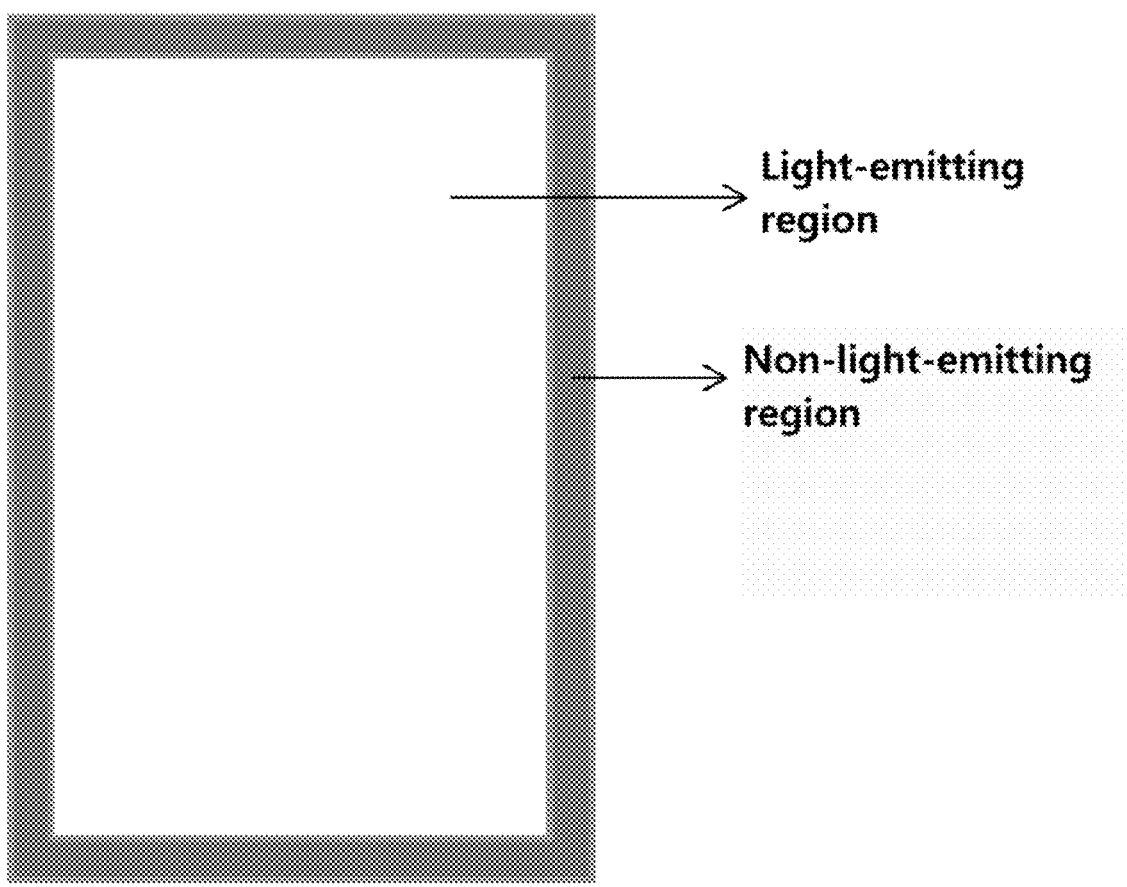

[Fig. 7A]
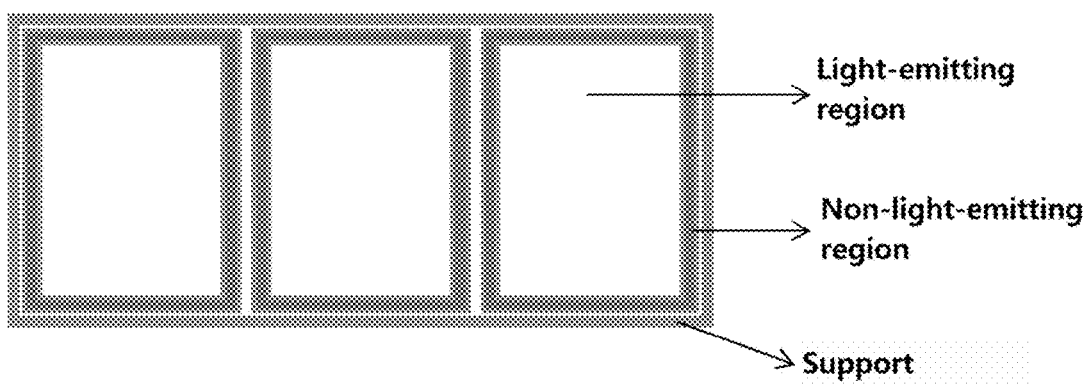

[Fig. 7B]
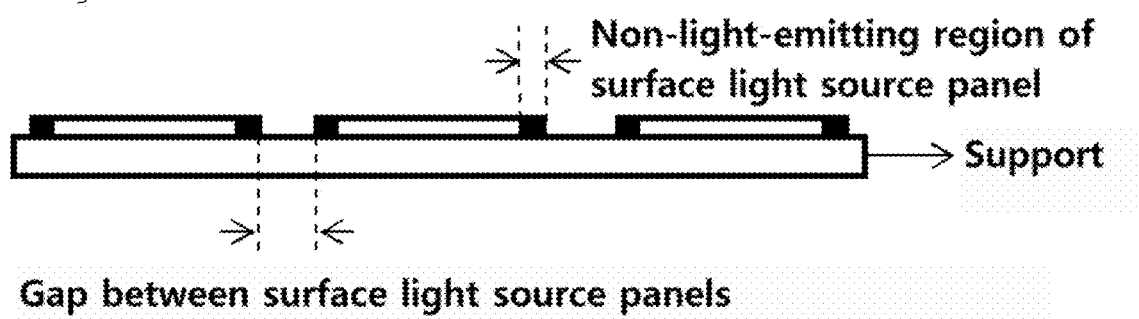

【Fig. 8】
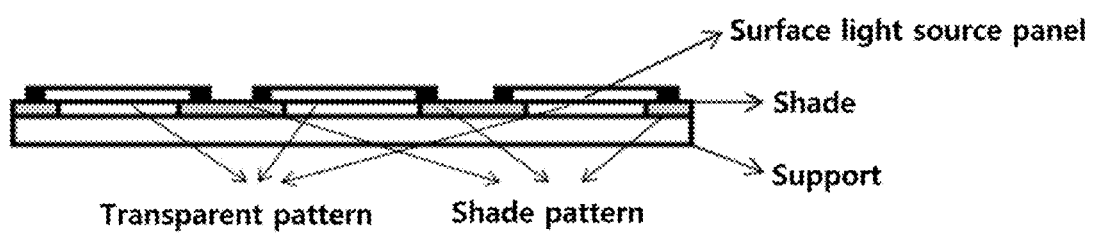
【Fig. 9】
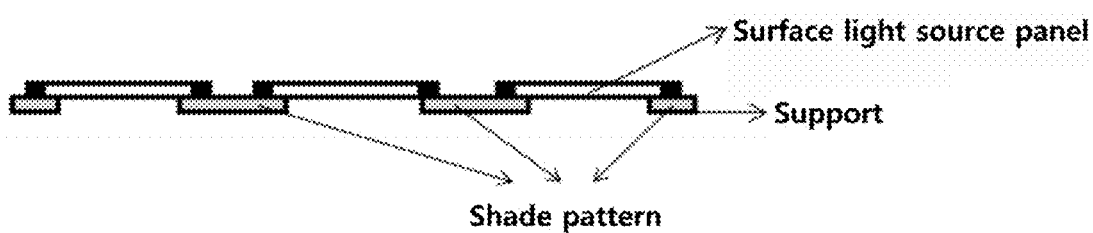

【Fig. 10】
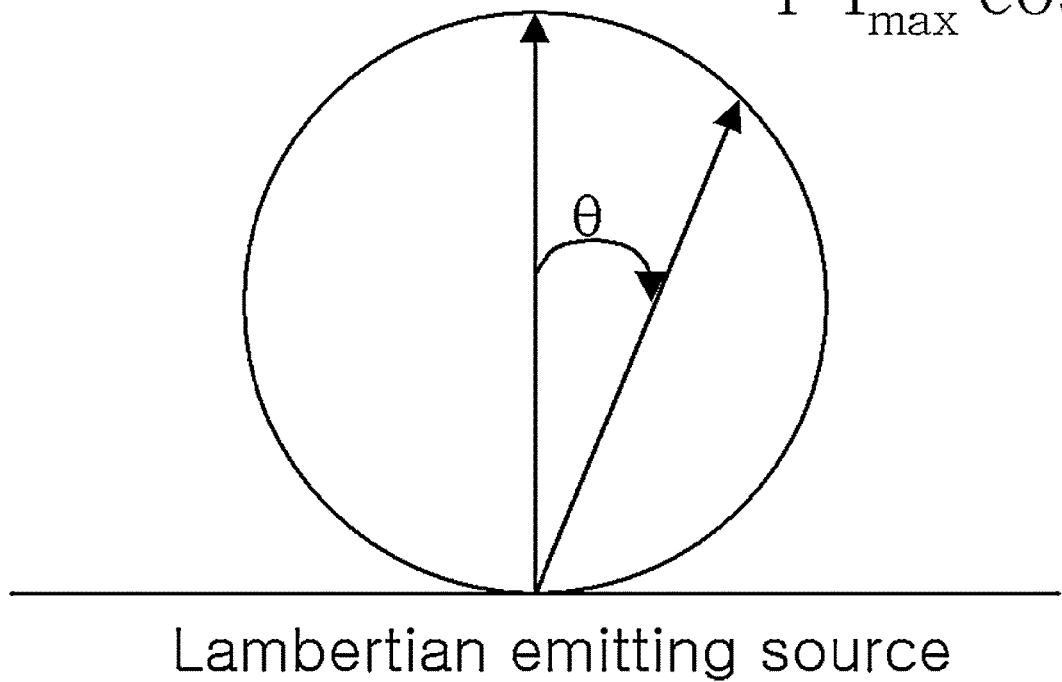

【Fig. 11】
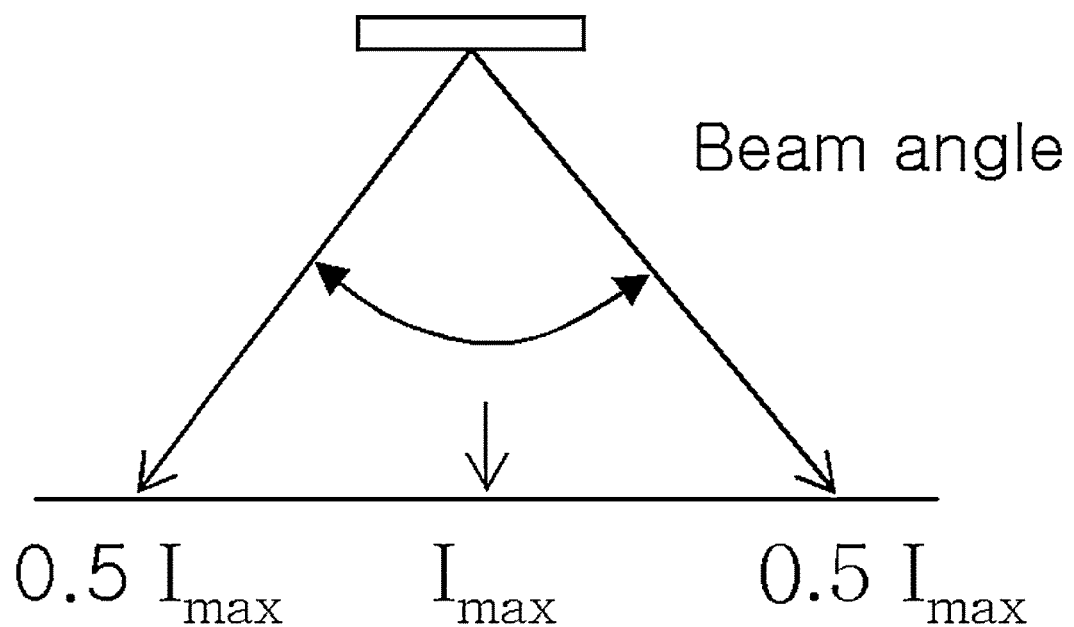

LIGHTING APPARATUS AND FABRICATING METHOD THEREOF

TECHNICAL FIELD

This application is a National Stage Entry of International Application No. PCT/KR2013/011363, filed Dec. 9, 2013, and claims the benefit of Korean Application No. 10-2012-0141534 filed on Dec. 7, 2012, all of which are hereby incorporated by reference in their entirety for all purposes as if fully set forth herein.

The present specification relates to a lighting apparatus and a method of fabricating the same.

BACKGROUND ART

If a display is a device for representing a thing seen by an eye like a real thing in a 2-D way, the lighting is an artificial device for generating light close to natural light. To this end, in the industry, methods capable of abundantly representing colors of things using natural light generated from the light of the sun are invented. Furthermore, as a color of light of the light of the sun in the middle of the day is different from that of light around evening, attempts to represent various color temperatures are being made even in artificial light sources. For example, efforts to increase R9 values indicative of a high Color Rendering Index (CRI), a color temperature, and the capability of a light source capable of well representing red are being made.

In the case of an LED, in general, a color temperature is controlled by coating an YAG fluorescent substance for changing blue into yellow on an element that emits blue by changing a concentration of the YAG fluorescent substance. If the concentration of the YAG fluorescent substance is low, white light having a high color temperature of a feeling of coolness is emitted. In contrast, if the concentration of the YAG fluorescent substance is high, white light having a low color temperature of a feeling of warmth is emitted. An R9 value, that is, a value indicating the degree that red inherent in a thing can be well represented, may be increased by adding a fluorescent substance for absorbing blue light and emitting red light instead of the YAG fluorescent substance.

A method used to fabricate a surface light source using LEDs includes a method of arraying small LED chips at the edge of a substrate that performs surface light emission (i.e., an edge type) and a method of placing several small LEDs on a light-emitting surface in a 2-D way and then adding a diffuser in order to cover the position of the LEDs (i.e., a direct type). In order for a surface light source, fabricated described above, to have a color control capability, LEDs that emit only red light or LEDs that emit only blue light are mixed and disposed. In such a case, a user can produce a low or high color temperature or various colors using the white surface light-emitting source.

In an OLED, unlike in the LED, the size of a unit element is relatively very large. In the case of a display using OLED technology, fine pixels of 1 mm or less are formed by the patterning of a substrate using lithography and the patterning of light-emitting substances, such as red, green, and blue, using a shadow mask, and the fine pixels are individually driven at the same time, thereby being capable of implementing various images. In contrast, if such methods are introduced in order to use OLEDs in the lighting, there is no practicality due to a very high price rise. For this reason, a relatively large surface light-emitting source that emits one kind of color, in particular, while light having a predetermined color temperature is fabricated. In general, an OLED has a size of 1×1 cm in width or height to 60×60 cm in width or height. Accordingly, unlike in the LED, in the OLED, a method of placing a plurality of light-emitting sources at the edge of a surface is used, or a method of forming one surface light-emitting source using a substrate itself because the OLED is large enough to be placed over a substrate formed of a surface so that it is not seen by an eye as in the direct type LED is used. Accordingly, a construction for producing the color control capability, such as that of the LED, is made difficult.

In the prior art, a method of sequentially stacking two elements over one substrate, pulling out intermediate electrodes from the elements separately, driving the intermediate electrodes individually, and performing color transform by controlling the intensity of light has been disclosed. However, only when the intermediate electrodes are transparent, two light-emitting colors placed over and under the intermediate electrodes can be mixed and discharged. To this end, thin metal having a relatively high permeability is used as the intermediate electrode. However, such a method may not becomes a practical method owing to a problem in that voltage rises due to an increase in the resistance of the intermediate electrode and a problem in that the intermediate electrodes have to be patterned in order to prevent a short problem occurring due to a direct and electrical connection between the upper and lower electrodes. Accordingly, a current lighting apparatus using an OLED panel is chiefly fabricated to produce a fixed white color.

DISCLOSURE

Technical Problem

Accordingly, the present invention has been made in an effort to solve the problems occurring in the related art, and an object of the present invention is to provide a lighting apparatus capable of implementing various types of brightness or various color temperatures and a method of fabricating the same.

Technical Solution

In order to achieve the above object, according to one aspect of the present invention, there is provided a lighting apparatus, including a support and three or more surface light source panels provided on the support, wherein at least two of the three or more surface light source panels emit pieces of light having different colors, respectively.

An embodiment of this specification provides a lighting apparatus, including a support and three or more surface light source panels provided on the support, wherein color coordinates of a combination of light-emitting colors pass through at least one point of a black-body radiation curve based on CIE 1931 color coordinates (x, y).

An embodiment of this specification provides a lighting apparatus, including a support and three or more surface light source panels provided on the support, wherein at least two of the three or more surface light source panels emit pieces of light having different colors and color coordinates of a combination of light-emitting colors pass through at least one point of a black-body radiation curve based on CIE 1931 color coordinates (x, y).

In accordance with yet another embodiment of this specification, the lighting apparatus further includes a driver for applying voltage or current to each of the surface light source panels or applying voltage or current to surface light source panels that emit the same color.

In accordance with yet another embodiment of this specification, the lighting apparatus further includes a controller for controlling the application of voltage or current to each of the surface light source panels or controlling the application of voltage or current to the surface light source panels depending on colors of the surface light source panels.

In accordance with yet another embodiment of this specification, the surface light source panels, respectively, comprise a bezel provided on at least one side of the surface light source panel.

In accordance with yet another embodiment of this specification, the bezel is provided on all the sides of the surface light source panel.

In accordance with yet another embodiment of this specification, the lighting apparatus further includes a gap between two or more adjacent surface light source panels of the three or more surface light source panels.

In accordance with yet another embodiment of this specification, the lighting apparatus further includes a shade for covering the bezel.

In accordance with yet another embodiment of this specification, the lighting apparatus further includes a shade for covering the gap.

In accordance with yet another embodiment of this specification, the shade is provided between the support and the surface light source panel, on an opposite surface of a surface of a surface light source panel contacts with the support, or on both sides of the surface light source panel.

In accordance with yet another embodiment of this specification, the shade includes a shade pattern provided in a region corresponding to the gap between the bezels or between the surface light source panels.

In accordance with yet another embodiment of this specification, the support is provided in a pattern form in a region corresponding to the gap between the surface light source panels.

In accordance with yet another embodiment of this specification, at least two of the surface light source panels are devices that emit light in a Lambertian form from a surface of the panels.

In accordance with yet another embodiment of this specification, the intensity I of light of the device that emits light in the Lambertian form satisfies Equation 1 below.

$$I = x \, I_{max} \cos \theta \quad \text{[Equation 1]}$$

wherein the $I_{max}$ means the intensity of light in a direction vertical to a light-emitting surface, the $\theta$ means an angle from a line perpendicular to the light-emitting surface, and x is a real number of 0.6 or more 1.5 or less as constant.

In accordance with yet another embodiment of this specification, at least one of the three or more surface light source panels is an OLED.

In accordance with yet another embodiment of this specification, the surface light source panel comprises at least one OLED and at least one LED.

In accordance with yet another embodiment of this specification, the surface light source panel has an area of 5 mm×5 mm or more.

In accordance with yet another embodiment of this specification, the surface light source panel has an area of 600 mm×600 mm or less.

In accordance with yet another embodiment of this specification, the lighting apparatus emits mixed white light having a color temperature of 2,000 K or more 15,000 K or less by turning on some of or all the three or more surface light source panels.

In accordance with yet another embodiment of this specification, a color rendering index of the lighting apparatus is 80 or more.

In accordance with yet another embodiment of this specification, the lighting apparatus includes one or more types of surface light source panels selected from a group consisting of at least one surface light source panel for emitting red light, at least one surface light source panel for emitting blue light, at least one surface light source panel for emitting green light, and at least one surface light source panel for emitting yellow light and at least one surface light source panel for emitting white light.

In accordance with yet another embodiment of this specification, the lighting apparatus includes at least one surface light source panel for emitting white light and at least one surface light source panel for emitting red light, at least one surface light source panel for emitting white light and at least one surface light source panel for emitting yellow light, at least one surface light source panel for emitting white light and at least one surface light source panel for emitting blue light, or at least one surface light source panel for emitting white light and at least one surface light source panel for emitting green light.

In accordance with yet another embodiment of this specification, the lighting apparatus includes at least one surface light source panel for emitting two or more types of colors having a complementary color relation.

In accordance with yet another embodiment of this specification, the lighting apparatus does not include a surface light source panel that emits white light.

In accordance with yet another embodiment of this specification, the lighting apparatus includes two or more types of surface light source panels selected from a group consisting of at least one surface light source panel for emitting red light, at least one surface light source panel for emitting blue light, at least one surface light source panel for emitting green light, and at least one surface light source panel for emitting yellow light.

In accordance with yet another embodiment of this specification, the lighting apparatus includes at least one surface light source panel for emitting red light and at least one surface light source panel for emitting blue light, at least one surface light source panel for emitting red light and at least one surface light source panel for emitting yellow light, at least one surface light source panel for emitting red light and at least one surface light source panel for emitting green light, at least one surface light source panel for emitting blue light and at least one surface light source panel for emitting yellow light, at least one surface light source panel for emitting blue light and at least one surface light source panel for emitting green light, or at least one surface light source panel for emitting yellow light and at least one surface light source panel for emitting green light.

In accordance with yet another embodiment of this specification, the lighting apparatus includes at least one surface light source panel for emitting red light, at least one surface light source panel for emitting blue light, and at least one surface light source panel for emitting yellow light, at least one surface light source panel for emitting red light, at least one surface light source panel for emitting blue light, and at least one surface light source panel for emitting green light, at least one surface light source panel for emitting red light, at least one surface light source panel for emitting yellow light, and at least one surface light source panel for emitting green light, or at least one surface light source panel for emitting blue light, at least one surface light source panel for emitting yellow light, and at least one surface light source panel for emitting green light.

In accordance with yet another embodiment of this specification, the lighting apparatus does not include a surface light source panel that emits white light, and the color coordinates of a light-emitting color that is emitted from the lighting apparatus pass through at least one point of a black-body radiation curve based on CIE 1931 color coordinates (x, y).

Advantageous Effects

As is apparent from the above description, in accordance with this specification, a color temperature can be controlled in various ways even when one lighting apparatus is used because the application of voltage to each of three or more surface light source panels is controlled. Accordingly, even when one type of lighting apparatus is installed, a color temperature can be controlled if necessary, for example, depending on a specific condition or a user's preference. Furthermore, in accordance with this specification, a lighting apparatus having high brightness can be provided by controlling the type of surface light source panel, a light-emitting color, a light-emitting substance, a light-emitting surface area, and the amount of current applied to a panel.

DESCRIPTION OF DRAWINGS

The above objects, and other features and advantages of the present invention will become more apparent after a reading of the following detailed description taken in conjunction with the drawings, in which:

FIG. 1 illustrates a range of color temperatures that may be implemented in a lighting apparatus in accordance with an embodiment of this specification;

FIGS. 2 to 4 illustrate various types of white light that may be produced using light sources having two or three types of different colors in the lighting apparatus in accordance with an embodiment of this specification;

FIG. 5 illustrates a pattern on a top surface of the lighting apparatus in which surface light source panels are disposed in accordance with an embodiment of this specification;

FIG. 6 illustrates the light-emitting region and non-light-emitting region of one surface light source panel in accordance with an embodiment of this specification;

FIG. 7A is a plan view of the lighting apparatus including three surface light source panels in accordance with an embodiment of this specification;

FIG. 7B is a side view of the lighting apparatus of FIG. 7A;

FIGS. 8 and 9 illustrate a lighting apparatus including shades in accordance with an embodiment of this specification;

FIG. 10 illustrates light emitted from a light-emitting source of an ideal Lambertian form; and FIG. 11 illustrates a beam angle of light.

MODE FOR DISCLOSURE

Reference will now be made in greater detail to a preferred embodiment of the invention, an example of which is illustrated in the accompanying drawings. Wherever possible, the same reference numerals will be used throughout the drawings and the description to refer to the same or like parts.

A lighting apparatus in accordance with an embodiment of this specification includes a support and three or more surface light source panels provided on the support. At least two of the three or more surface light source panels emit pieces of light having different colors, respectively.

The lighting apparatus according to the embodiment includes the three or more surface light source panels whose light-emitting colors are two or more types. In such a construction, the lighting apparatus may include a controller for controlling the application of voltage or current to each of the surface light source panels. The construction of the lighting apparatus according to the embodiment is different from a construction in which a plurality of LED light sources of a dot or line form is disposed at the edge of a substrate or the plurality of LED light sources is disposed over the substrate and a diffuser is disposed over the substrate in that the lighting apparatus according to the embodiment includes the surface light source panels. Furthermore, the construction according to the embodiment is quite different from a construction in which only one OLED light source of a surface form is disposed. Furthermore, the construction according to the embodiment is quite different from a construction in which a plurality of light sources formed of only one kind of color is disposed. The characteristics of the construction of the present invention are described in more detail below.

The lighting apparatus according to the embodiment includes three or more light sources, which are surface light sources. Here, the surface light source is different from a conventional LED light source of a dot or line form. For example, the surface light source panel may have an area of 5 mm×5 mm or more. The embodiment is advantageous in that a light guide plate for diffusing light emitted from a dot light source or a line light source or a diffuser for covering the dot light source or the line light source because a surface light source not the dot light source or the line light source is used.

Furthermore, in the lighting apparatus according to the embodiment, a danger of a short problem attributable to a large-area implementation can be minimized because the three or more surface light source panels are used without using one large-area OLED surface light source. For example, in accordance with an embodiment of this specification, each of the surface light source panels may have an area of 600 mm×600 mm or less or 360,000 $mm^2$ or less.

In a conventional lighting apparatus, all parts are configured to emit light having the same brightness and color. In contrast, in one lighting apparatus in accordance with this specification, both a state in which light having the same brightness and color is emitted and a state in which pieces of light having two or more different colors are emitted may be implemented. That is, if all surface light source panels that emit pieces of light having two or more colors are driven simultaneously, a user can see pieces of light having various colors that are emitted from the surface light source panels if the user sees the lighting apparatus of this specification, but cannot feel the presence of various colors if the user sees a thing brightened up by light emitted from the lighting apparatus instead of directly seeing the lighting apparatus. In this case, the lighting apparatus can be used as a common lighting apparatus. Furthermore, if a thing lightened up by the lighting apparatus is a white wall, white light is radiated to the white wall because pieces of light emitted from the surface light source panels are mixed.

FIG. 1 illustrates a range of color temperatures that may be implemented in a lighting apparatus in accordance with an embodiment of this specification. More particularly, a graph of FIG. 1 shows a method of representing the color of a light source called a CIE 1931 chromaticity diagram in accordance with a standard method.

In particular, in the lighting apparatus in accordance with an embodiment of this specification, the color coordinates of a combination of light-emitting colors that are emitted from the lighting apparatus pass through at least one point of a black-body radiation curve based on CIE 1931 color coordinates (x, y). Here, the surface light source panels included in the lighting apparatus may include or may not include a surface light source panel that emits white light.

The sun is representative light that performs black-body radiation. Accordingly, if the color coordinates of a combination of light-emitting colors emitted from the lighting apparatus pass through the black-body radiation curve, obtained light has a characteristic similar to that of the black-body radiation and thus become similar to the light of the sun, that is, natural light.

FIGS. 2 to 4 illustrate various types of white light that may be produced using light sources having two or three types of different colors in the lighting apparatus in accordance with an embodiment of this specification. In FIGS. 2 to 4, all the color coordinates of light-emitting colors emitted from the lighting apparatus pass through at least one point of the black-body radiation curve.

In accordance with an embodiment of this specification, the color coordinate region of a light-emitting color emitted from the lighting apparatus includes at least part of the black-body radiation curve based on CIE 1931 color coordinates (x, y). Here, the color coordinate region means a range of color coordinates that can be implemented if a light emission implementation is possible within color coordinates of a specific area using the lighting apparatus as in FIG. 3.

FIG. 5 illustrates a pattern on a top surface of the lighting apparatus in which surface light source panels are disposed in accordance with an embodiment of this specification. A structure in which the surface light source panels are disposed is not limited to the pattern of FIG. 5, but the surface light source panels may be disposed in various forms so that the aforementioned condition of the embodiment is satisfied. In FIG. 5, a panel B indicates blue light emission, a panel R indicates red light emission, and a panel having no indication indicates white light emission. It is to be noted that the B and R are used to only indicate light-emitting colors and a letter, such as B or R, is not indicated in a real panel.

In accordance with an embodiment of this specification, the surface light source panels, respectively, comprise a bezel provided on at least one side of the surface light source panel. Furthermore, in accordance with an embodiment of this specification, the bezel may be provided on all the sides of the surface light source panel.

The bezel may be the non-light-emitting region of the surface light source panel. More particularly, in accordance with an embodiment of this specification, the lighting apparatus may include a light-emitting region and a non-light-emitting region. More particularly, if a surface light source panel is an OLED, a non-light-emitting region may be necessary.

FIG. 6 illustrates the light-emitting region and non-light-emitting region of one surface light source panel in accordance with an embodiment of this specification. More particularly, the non-light-emitting region of the surface light source panel may be a region to be connected to electrodes. Alternatively, the non-light-emitting region of the surface light source panel may be a region on which adhesives have been coated upon sealing for blocking moisture or air. A bezel may be provided in the non-light-emitting region of FIG. 6.

In accordance with an embodiment of this specification, the lighting apparatus may include an interval between the surface light source panels. In other words, the lighting apparatus may include a gap between two or more adjacent surface light source panels.

FIG. 7A is a diagram showing that three surface light source panels are included in order to describe the structure of a gap between the surface light source panels in the lighting apparatus in accordance with an embodiment of this specification. In accordance with embodiments of this specification, however, the three surface light source panels do not need to have the same size, and an array in which the three surface light source panels are disposed is not limited to a parallel array as shown in FIG. 7A. FIG. 7B illustrates a stack structure showing the side of the surface light source panels shown in FIG. 7A.

In accordance with an embodiment of this specification, the lighting apparatus may further include a shade for covering a gap between the bezels or between the surface light source panels.

The shade may be provided between the support and the surface light source panel, on a surface opposite a surface that comes in contact with the surface light source panel, or on both sides of the surface light source panel. The shade may include a shade pattern having a form corresponding to a region in which the gap between the bezels or between the surface light source panels is provided. A transparent pattern may be provided or may not be provided between the shade patterns.

The meaning that the shade may include a shade pattern having a form corresponding to a region in which the gap between the bezels or between the surface light source panels is provided includes that the shade may have the same size and form as the gap between the bezels or between the surface light source panels and the shade has the same form as the gap between the bezels or between surface light source patterns, but has a size different from that of the gap. A line width of the shade pattern may be selected in a range of 80% to 200% of a line width of the bezel or the gap.

Materials for the shade pattern are not specially limited if the materials have a function of optically covering the bezel or the gap. For example, the shade pattern can cover the existence of the bezel or the gap by way of the refraction of light using materials having a refractive index different from those of an air layer or a transparent pattern. Furthermore, conventional materials for a diffuser or a light guide plate may be used as the materials for the shade pattern, but the present invention is not limited thereto.

Furthermore, in accordance with an embodiment of this specification, the support may be provided in a region corresponding to the gap between the bezels or between the surface light source panels in a pattern form. In such a case, the support provided in the pattern form can play a role as the aforementioned shade pattern. In other words, the support provided in the pattern form can play a role as both the support and the shade. Even in such a case, a transparent pattern may be additionally provided between the patterns of the support.

In accordance with an embodiment of this specification, the support may be provided to come in contact with the bottom of the non-light-emitting region of an adjacent surface light source panel. Furthermore, the support may connect adjacent surface light source panels that are provided to come in contact with the bottom of the non-light-emitting region of a surface light source panel.

The shade or the support having the pattern form can reduce the visibility of the non-light-emitting region of the surface light source panel and the visibility of the gap between the bezels or between the surface light source panels. That is, the shade or the support having the pattern form has an effect that simultaneously covers the non-light-emitting region of the surface light source panel and the gap between the bezels or between the surface light source panels.

FIGS. 8 and 9 illustrate a lighting apparatus including shades in accordance with an embodiment of this specification. More particularly, FIG. 8 shows an example in which shades are provided between surface light source panels and a support. FIG. 9 shows an example in which supports play a role as shade patterns.

In accordance with another embodiment of this specification, the lighting apparatus may include a driver for applying voltage or current to each of the surface light source panels or for applying voltage or current to surface light source panels that emit the same color.

In accordance with an embodiment of this specification, the driver may be provided for each light-emitting color and configured to apply voltage or current to a surface light source panel for each light-emitting color.

Furthermore, in accordance with yet another embodiment of this specification, the lighting apparatus may include a controller for controlling the application of voltage or current to each of the surface light source panels or for controlling the application of voltage or current to surface light source panels depending on colors of the surface light source panels. More particularly, the controller can control the application of current or voltage to all surface light source panels within the lighting apparatus. Alternatively, the controller may control the application of current or voltage to each of the surface light source panels. Alternatively, the controller may be provided for each light-emitting color and configured to control the application of voltage or current to a surface light source panel for each light-emitting color.

If such a driver or such a controller or both are included, the three or more surface light source panels included in the lighting apparatus may be controlled in such a way as to be emitted or to be not emitted. Accordingly, a color temperature of the lighting apparatus can be controlled by controlling the number of surface light source panels that will emit light according to a light-emitting color, if necessary. Furthermore, a color temperature of the lighting apparatus can be controlled by controlling the amount of current, applied to a surface light source panel for each color, through the controller. Furthermore, the brightness of the lighting apparatus can be controlled by simultaneously increasing or decreasing current that is applied to the surface light source panels at a predetermined color temperature. The driver or the controller or both may control the surface light source panels individually and may control a group of surface light source panels that emit the same color. For example, in a lighting apparatus including a surface light source panel that emits four pieces of white light, a surface light source panel that emits three pieces of blue light, and a surface light source panel that emits three pieces of yellow light, only the four pieces of white light may be emitted using three drivers for driving respective light-emitting colors. Alternatively, in order to emit white light having a high color temperature of a feeling of coolness, the four pieces of white light and the three pieces of blue light may be emitted. Alternatively, in order to emit white light having a low color temperature of a feeling of warmth, the four pieces of white light and the three pieces of yellow light may be emitted. Furthermore, the three pieces of blue light and the three pieces of yellow light may be emitted so that they are mixed to implement white light when they are radiated to a wall surface or a bottom surface.

Furthermore, in accordance with an embodiment of this specification, if an additional driver for driving each light-emitting color is used, a color temperature and brightness of the lighting apparatus can be finely controlled by controlling the intensity of each light-emitting color.

If the lighting apparatus in accordance with an embodiment of the present invention includes one or more surface light source panels that emit three types of color light other than white light, the lightening and light emission strength of each of the surface light source panels can be controlled using the aforementioned driver or controller or both. Accordingly, all color temperatures within an area that connect the color coordinates of three types of colors in the CIE 1931 color coordinates can be implemented.

The driver can perform current driving on the surface light source panels that are connected in series, in parallel, or in a serial and parallel mixing form.

In accordance with yet another embodiment of this specification, at least two of the surface light source panels may be devices that emit light in a Lambertian form from surfaces of the surface light source panels.

FIG. 10 illustrates light emitted from a light-emitting source of an ideal Lambertian form. More particularly, if light is emitted in the ideal Lambertian form, the light has directivity, such as that of FIG. 10. That is, when a specific point is selected in a light source having a surface light source form, light emitted around the specific point has the highest intensity in a direction vertical to a surface of the light source, and light emission strength at this time may become Imax. Furthermore, as an angle is increased from a line perpendicular to the light-emitting surface, the intensity of light is reduced in proportion to cos θ. Here, light emission strength I can be represented as $I=I_{max} \cos \theta$.

The intensity I of light of the device that emits light in the Lambertian form described in this specification satisfies Equation 1 below.

$$I = x \, I_{max} \cos \theta \quad \quad \text{[Equation 1]}$$

The $I_{max}$ means the intensity of light in a direction vertical to a light-emitting surface, the θ means an angle from a line perpendicular to the light-emitting surface, and x is a constant and a real number of 0.6 or more 1.5 or less.

If Equation 1 is satisfied, although a lighting apparatus having a combination of the surface light source panels having various colors is used, pieces of light emitted from the lighting apparatus are mixed, thus appearing as white light on a wall surface or a bottom surface. Such a relation can be described as a beam angle defined in FIG. 11. When a beam angle is great, light emitted from a light source is widely spread. In contrast, when a beam angle is small, there is an effect in that light emitted from a light source is concentrated on a narrow area. That is, if a lighting apparatus is fabricated using two surface light source panels that emit two different colors, when a beam angle is small, the two colors are rarely mixed when pieces of light of the two colors are radiated to a bottom surface, with the result that there is a great irregularity between the colors depending on the position of the bottom surface. In contrast, when a beam angle is great, irregularity is greatly reduced. If a beam angle is excessively increased, however, the intensity of light that drops vertically from the lighting source is relatively reduced and even unnecessary parts are illuminated. As a result, a corresponding lighting apparatus may become an inefficient lighting apparatus. Accordingly, in accordance with an embodiment of this specification, the surface light source may have a light emission form close to a Lambertian form.

In the lighting apparatus in accordance with an embodiment of this specification, at least one of the surface light source panels may be an OLED. Alternatively, in the lighting apparatus in accordance with an embodiment of this specification, the surface light source panel may include at least one OLED and at least one LED.

In accordance with yet another embodiment of this specification, at least one of the surface light source panels may include an OLED as a device that emits light in a Lambertian form. In accordance with the present embodiment, all surface light source panels may be OLEDs, and some of surface light source panels may be OLEDs.

Here, the OLED means that an organic substance is used as a light-emitting substance. An additional organic substance for making efficient the transport of charges may be used as the OLED in addition to the light-emitting substance, if necessary. The OLED includes an organic light-emitting layer of at least one layer between two electrodes. For example, the OLED may include charge injection or transport layers, for example, an electron transport layer, an electron injection layer, a hole transport layer, a hole injection layer, a hole blocking layer, and an electron blocking layer between the organic light-emitting layer and the electrodes. Furthermore, two or more light-emitting units including an organic light-emitting layer of one or more layers may be stacked between the two electrodes, if necessary. The light-emitting unit means a minimum unit that includes an organic light-emitting layer and can emit light when voltage is applied thereto. An intermediate conduction layer or a charge generation layer may be provided between the light-emitting units. The intermediate conduction layer may be made of conductive materials that may be used as materials for the electrodes. The stacked two or more light-emitting units may be provided in such a way as to emit light having the same color or pieces of light having different colors, respectively. For example, in an OLED having a stacked structure, two or more light-emitting units may be provided to emit white light by emitting pieces of light having different colors, respectively.

In accordance with yet another embodiment of this specification, the surface light source panel includes at least one OLED and at least one LED. If only some of the surface light source panels are OLEDs, the remaining surface light source panels may be LEDs. Here, the LED means a light-emitting device other than the OLED.

If only an OLED panel is used, it is advantageous to construct a very thin lighting source in view of the characteristics of an OLED. In contrast, if OLED panels and LED panels are mixed and used, a high-efficiency lighting apparatus can be fabricated because an OLED panel having the highest efficiency and an LED panel having the highest efficiency are adopted depending on the color. For example, if a surface light source is fabricated using LED technology, blue and white panels having a high color temperature can be fabricated with high efficiency. However, it is relatively difficult to fabricate a high-efficiency green or yellow panel using current LED technology. In contrast, a high-efficiency green, yellow, and red panel can be easily fabricated using current OLED technology, but it is difficult to fabricate a blue panel or a white panel having a low color temperature. Accordingly, if panels of colors having high efficiency are selected and combined according to LED and OLED technologies based on such advantages and disadvantages, a lighting apparatus having the highest efficiency can be fabricated.

Accordingly, this is quite different from a role and characteristic in which OLED and LED light sources are simply mixed with and used in a lighting apparatus. For example, a method of constructing an OLED in a surface light source form and constructing an LED in a dot light source form and driving the OLED and the LED separately or simultaneously is different from a construction for implementing various color transforms to be achieved by this specification and an object of deviating from a simple and repetitive form and color by implementing various colors in a lighting source.

More particularly, in the case of an LED, a blue chip of about 460 nm is basically used to implement white light, and a technique for changing some of blue into another color by coating a fluorescent substance on the inside or part of packaging materials in order to implement a different color is used. For example, in order to implement white light, a method of fabricating a chip that generates the white light in which blue light and yellow light are mixed based on the principle in which a yellow fluorescent substance is coated on a packaging substance based on a blue chip and the fluorescent substance absorbs the blue light and emits the yellow light again is used. In order to emit yellow light, a chip that emits the yellow light not including a blue component can be fabricated by coating a large amount of a yellow fluorescent substance. However, such a fluorescent substance tends to have very low efficiency in a process of changing a blue component into another component because the fluorescent substance has relatively low efficiency. In contrast, in the case of an OLED, if a yellow, green, or red dopant using a phosphorescence method is used in an OLED light-emitting device without using such color transform, internal light conversion efficiency may reach 100%. Accordingly, when implementing the lighting apparatus according to this specification, if a blue LED panel or a surface light source using an LED chip that includes white having a high color temperature, that is, a relatively small amount of a yellow fluorescent substance, is partially used and yellow, green, or red are used simultaneously, partially, or individually, the lighting apparatus having the highest efficiency that has not been implemented so far can be implemented.

In accordance with an embodiment of this specification, the lighting apparatus may have a color rendering index of 80 or more.

The color rendering index indicates whether light has a color wavelength similar to natural light to what degree, assuming that the natural light is 100. That is, if a color rendering index becomes higher, it may mean that light of various wavelengths is generated with sufficient strength.

In accordance with yet another embodiment of this specification, the surface light source panel has two or more types or three types of light-emitting colors.

In accordance with the embodiment, the surface light source panels may have two or more types of light-emitting colors. For example, at least two of three or more surface light source panels may be designed to emit light having different colors. For a detailed example, in the case of a lighting apparatus fabricated to include three surface light source panels, the two of the three surface light source panels may be fabricated to emit white light and the remaining one surface light source panel may be fabricated to emit red light.

For another example, in the case of a lighting apparatus fabricated to include four surface light source panels, two of the four surface light source panels may be provided to emit blue light and the remaining two surface light source panels may be provided to emit yellow light. For yet another example, in the case of a lighting apparatus fabricated to include seven surface light source panels, four of the seven surface light source panels may be provided to emit white light, two of the remaining three surface light source panels may be provided to emit blue light, and the remaining one surface light source panel may be provided to emit yellow light.

In accordance with an embodiment of this specification, the lighting apparatus includes at least one surface light source panel that emits white light.

In accordance with an example, the lighting apparatus may include one or more types of surface light source panels selected from a group consisting of at least one surface light source panel for emitting red light, at least one surface light source panel for emitting blue light, at least one surface light source panel for emitting green light, and at least one surface light source panel for emitting yellow light and at least one surface light source panel for emitting white light.

More particularly, the lighting apparatus may include at least one surface light source panel for emitting white light and at least one surface light source panel for emitting red light, at least one surface light source panel for emitting white light and at least one surface light source panel for emitting yellow light, at least one surface light source panel for emitting white light and at least one surface light source panel for emitting blue light, or at least one surface light source panel for emitting white light and at least one surface light source panel for emitting green light.

In accordance with yet another embodiment of this specification, the lighting apparatus does not include a surface light source panel that emits white light.

In accordance with an example, the lighting apparatus may include two or more types of surface light source panels selected from a group consisting of at least one surface light source panel for emitting red light, at least one surface light source panel for emitting blue light, at least one surface light source panel for emitting green light, and at least one surface light source panel for emitting yellow light.

In accordance with another example, the lighting apparatus may include two or more types of surface light source panels for emitting pieces of light having different colors and include at least one surface light source panel for emitting red light and at least one surface light source panel for emitting blue light, at least one surface light source panel for emitting red light and at least one surface light source panel for emitting yellow light, at least one surface light source panel for emitting red light and at least one surface light source panel for emitting green light, at least one surface light source panel for emitting blue light and at least one surface light source panel for emitting yellow light, at least one surface light source panel for emitting blue light and at least one surface light source panel for emitting green light, or at least one surface light source panel for emitting yellow light and at least one surface light source panel for emitting green light.

In accordance with yet another example, the lighting apparatus may include three or more types of surface light source panels for emitting pieces of light having different colors and include at least one surface light source panel for emitting red light, at least one surface light source panel for emitting blue light, and at least one surface light source panel for emitting yellow light, at least one surface light source panel for emitting red light, at least one surface light source panel for emitting blue light, and at least one surface light source panel for emitting green light, at least one surface light source panel for emitting red light, at least one surface light source panel for emitting yellow light, and at least one surface light source panel for emitting green light, or at least one surface light source panel for emitting blue light, at least one surface light source panel for emitting yellow light, and at least one surface light source panel for emitting green light.

In accordance with an embodiment of this specification, the lighting apparatus may include one or more surface light source panels each for emitting two or more types of colors having a complementary color relation. Here, the lighting apparatus does not include a surface light source panel that emits white light.

The number of types of colors determines a color transform capability to be achieved by this specification. For example, as shown on the upper side of the CIE 1931 table of FIG. 2, if a lighting apparatus is fabricated using a light source having two types of colors having color coordinates A and B, colors that may be represented by combining the intensities of the colors by relatively controlling the intensities can be indicated by color coordinates over a line that connects two lines in the table. Accordingly, in the case of FIG. 2, colors between blue indicated by A and yellow indicated by B can be represented in addition to blue indicated by A and yellow indicated by B. Furthermore, as shown in FIG. 2, various types of white light corresponding to black-body radiation, of the colors between blue indicated by A and yellow indicated by B, can also be represented. That is, various types of white light that are present between 3,000 K and 15,000 K can be easily implemented by controlling the intensities of the colors, if necessary.

Alternatively, if three types of colors may be used as in FIG. 3. Colors that may be represented when three types of colors are mixed are indicated by all coordinates within a triangle that is formed by connecting three dots. As a result, colors within a very wide area can be represented. In the case of FIG. 3, colors at dots A, B, and C and all color coordinates within a triangle formed by the dots A, B, and C can be implemented. Furthermore, various types of white light from 2,200 K to 15,000 K included in the triangle can be implemented.

A lighting apparatus can be fabricated by mixing two or more types of colors including white. FIG. 4 shows an example of a lighting apparatus including white light having a color temperature 5,500K indicated by coordinates A, red light having coordinates B, and blue light having coordinates C. If only the white light is turned on, the white light of 5,500 K can be used as a lighting apparatus. In such a case, a pattern having the white light can be highlighted because only white is turned on the lighting apparatus. If the white light and the blue light indicated by the coordinates C are mixed and turned on, all colors over a line that connects the dot A and the dot C can be implemented. In particular, in such a case, various types of white light from 5,500 K to 15,000 K can be implemented. If the white light indicated by the coordinates A and the red light indicated by the coordinates B are to be turned on, various colors from 3,000 K to 5,500 K can be implemented even without turning on the white light.

Furthermore, color temperatures may be controlled by turning on all the three colors.

If a lighting apparatus is fabricated using a plurality of colors including a sufficient visible ray region, a color rendering index (CRI) can be increased to a maximum. In general, in the case of an LED, a chip that emits blue light is used and a yellow fluorescent substance is included in a packaging substance so that part of the blue light is changed into yellow light. In such a case, white light is emitted by a mixture of the two colors. Accordingly, the blue light and the yellow light of the visible ray region are highlighted and emitted, and light of a wavelength band placed between the blue light and the yellow light or outside the blue light and the yellow light is relatively insufficient. In the case of an OLED, in an existing method of producing white light, a plurality of light-emitting layers is sequentially deposited between a hole transport layer and an electron transport layer so that various types of color light are emitted, or devices are consecutively stacked between an anode and a cathode twice or three times using a stack structure and a different type of color light is emitted from each of the devices between the anode and the cathode so that three or more types of color light are emitted. Accordingly, an OLED surface light source having a color rendering index of 90 or more can be fabricated. The lighting apparatus in accordance with an embodiment of this specification can be fabricated to be close to an incandescent lamp because blue, green, red, or middle colors between blue, green, and red can be freely used in addition to white light that is implemented by the above methods. That is, in accordance with an embodiment of this specification, the lighting apparatus may have a color rendering index of 100 or more.

In accordance with an embodiment of this specification, the area or shape of a light-emitting color may need to be controlled, if necessary. For example, if light-emitting colors of surface light source panels include white, yellow, and blue, the areas of the surface light source panels that form white, yellow, and blue may be made different. Alternatively, the surface light source panels may be configured to have various shapes, such as a square, a rectangle, a triangle, a polygon having a pentagon or more, a circle, and an oval. An existing lighting apparatus is configured to include only one color, in general, white. In contrast, the lighting apparatus in accordance with an embodiment of this specification is configured to include two or more colors and surface light source panels for emitting the two or more colors are properly arrayed within the lighting apparatus. Accordingly, the lighting apparatus according to this specification can play a role as a lighting source capable of changing a color temperature and adds a decorative factor other than the monotony.

If white light is implemented using an existing edge type or direct type LED surface light source, a change of a color is possible as in this specification, but a pattern including various colors cannot be implemented as in this specification because colors are already mixed and produced. In accordance with an embodiment of this specification, however, even an LED panel fabricated in a surface light source form can be used as a lighting source for emitting various color temperatures and various colors in accordance with the illustrated method.

If the lighting apparatus according to this specification is fabricated, there is an effect in that the yield is increased. The size or required amount of light of a lighting apparatus is different depending on a work space that is used. In general, one lighting apparatus used in the ceiling of an office requires about 1,000 lumen to 3,000 lumen, and a greater amount of light may be necessary. Furthermore, when the lighting apparatus is installed at the ceiling, the lighting apparatus is chiefly fabricated as a rectangular panel having a size of 600 mm×600 mm or 300 mm×300 mm or a similar size if the lighting apparatus is not a pendant type. In an OLED panel, however, a minute defect that forms one short circuit makes the entire panel inoperable in view of the characteristics of the OLED panel. Accordingly, as the area of each of panels that form a lighting apparatus is increased, there is a good possibility that a short circuit may be present in each panel and a production yield is reduced. For example, if one short channel is present in a panel of 1,000 mm×1,000 mm in size and such a panel is fabricated as one panel, a corresponding lighting apparatus has a failure. If a lighting apparatus is fabricated using 100 panels of 100 mm×100 mm in size, the yield may be 99% because a failure occurs only in one of the 100 panels. Furthermore, if a lighting apparatus is fabricated using a plurality of panels as described above and the panels are configured to produce two or more colors, various advantages can be achieved because color temperatures can be changed as described above. In accordance with an embodiment, the lighting apparatus according to this specification can emit pieces of mixed white light having a color temperature of 2,000 K or more 15,000 K or less by turning on some of or all surface light source panels.

The lighting apparatus according to this specification may further include fixing means for fixing the surface light source panels to the support.

The lighting apparatus according to this specification may further include fixing means for fixing the lighting apparatus to a ceiling or a wall surface.

The invention claimed is:

1. A lighting apparatus, comprising:
a support; and
three or more surface light source panels provided on the support,
wherein at least two of the three or more surface light source panels emit pieces of light having different colors, respectively,
wherein color coordinates of light emitted from the lighting apparatus pass through at least one point of a black-body radiation curve based on CIE 1931 color coordinates (x, y),
wherein at least two of the surface light source panels emit light in a Lambertian form, and
wherein an intensity I of the light emitted from the at least two of the surface light source panels in the Lambertian form satisfies Equation 1 below:

$$I = x \, I_{max} \cos \theta \qquad \text{[Equation 1]}$$

wherein $I_{max}$ means the intensity of light in a direction vertical to a light-emitting surface, θ means an angle from a line perpendicular to the light-emitting surface, and x is a real number of 0.6 or more 1.5 or less as constant.

2. The lighting apparatus of claim 1, further comprising a driver for applying voltage or current to each of the surface light source panels or applying voltage or current to surface light source panels that emit an identical color.

3. The lighting apparatus of claim 1, further comprising a controller for controlling an application of voltage or current to each of the surface light source panels or controlling an application of voltage or current to the surface light source panels depending on colors of the surface light source panels.

4. A lighting apparatus, comprising:
a support;
three or more surface light source panels provided on the support, wherein the surface light source panels, respectively, comprise a bezel provided on at least one side of the surface light source panel; and a shade for covering the bezel, wherein at least two of the three or more surface light source panels emit pieces of light having different colors, respectively, wherein the shade is provided between the support and the surface light source panel, on an opposite surface of a surface of a surface light source panel contacts with the support, or on both sides of the surface light source panel.

5. A lighting apparatus, comprising:

a support;

three or more surface light source panels provided on the support;

a gap between at least two adjacent surface light source panels of the three or more surface light source panels; and a shade for covering the gap, wherein at least two of the three or more surface light source panels emit pieces of light having different colors, respectively, wherein the shade is provided between the support and the surface light source panel, on an opposite surface of a surface of a surface light source panel contacts with the support, or on both sides of the surface light source panel.

6. The lighting apparatus of claim 5, wherein the support is provided in a pattern form in a region corresponding to the gap between the surface light source panels.

7. The lighting apparatus of claim 1, wherein at least one of the three or more surface light source panels is an OLED.

8. The lighting apparatus of claim 1, wherein the surface light source panel comprises at least one OLED and at least one LED.

9. The lighting apparatus of claim 1, wherein the surface light source panel has an area of 5 mm×5 mm or more.

10. The lighting apparatus of claim 1, wherein the surface light source panel has an area of 600 mm×600 mm or less.

11. The lighting apparatus of claim 1, wherein the lighting apparatus emits mixed white light having a color temperature of 2,000 K or more 15,000 K or less by turning on some of or all the three or more surface light source panels.

12. The lighting apparatus of claim 1, wherein a color rendering index of the lighting apparatus is 80 or more.

13. The lighting apparatus of claim 1, wherein the lighting apparatus comprises:

one or more types of surface light source panels selected from a group consisting of at least one surface light source panel for emitting red light, at least one surface light source panel for emitting blue light, at least one surface light source panel for emitting green light, and at least one surface light source panel for emitting yellow light; and at least one surface light source panel for emitting white light.

14. The lighting apparatus of claim 1, wherein the lighting apparatus comprises at least one surface light source panel for emitting white light and at least one surface light source panel for emitting red light, at least one surface light source panel for emitting white light and at least one surface light source panel for emitting yellow light, at least one surface light source panel for emitting white light and at least one surface light source panel for emitting blue light, or at least one surface light source panel for emitting white light and at least one surface light source panel for emitting green light.

15. The lighting apparatus of claim 1, wherein the lighting apparatus comprises at least one surface light source panel for emitting two or more types of colors having a complementary color relation.

16. The lighting apparatus of claim 15, wherein the lighting apparatus does not include a surface light source panel that emits white light.

17. The lighting apparatus of claim 1, wherein the lighting apparatus comprises two or more types of surface light source panels selected from a group consisting of at least one surface light source panel for emitting red light, at least one surface light source panel for emitting blue light, at least one surface light source panel for emitting green light, and at least one surface light source panel for emitting yellow light.

18. The lighting apparatus of claim 1, wherein the lighting apparatus comprises at least one surface light source panel for emitting red light and at least one surface light source panel for emitting blue light, at least one surface light source panel for emitting red light and at least one surface light source panel for emitting yellow light, at least one surface light source panel for emitting red light and at least one surface light source panel for emitting green light, at least one surface light source panel for emitting blue light and at least one surface light source panel for emitting yellow light, at least one surface light source panel for emitting blue light and at least one surface light source panel for emitting green light, or at least one surface light source panel for emitting yellow light and at least one surface light source panel for emitting green light.

19. The lighting apparatus of claim 1, wherein the lighting apparatus comprises at least one surface light source panel for emitting red light, at least one surface light source panel for emitting blue light, and at least one surface light source panel for emitting yellow light; at least one surface light source panel for emitting red light, at least one surface light source panel for emitting blue light, and at least one surface light source panel for emitting green light; at least one surface light source panel for emitting red light, at least one surface light source panel for emitting yellow light, and at least one surface light source panel for emitting green light; or at least one surface light source panel for emitting blue light, at least one surface light source panel for emitting yellow light, and at least one surface light source panel for emitting green light.

* * * * *